United States Patent
Grober (10) Patent No.: US 10,440,835 B1
(45) Date of Patent: Oct. 8, 2019

(54) FORMING THROUGH HOLES THROUGH EXPOSED DIELECTRIC MATERIAL OF COMPONENT CARRIER

(71) Applicant: AT&S Austria Technologie & Systemtechnik Aktiengesellschaft, Leoben (AT)

(72) Inventor: Gernot Grober, Graz (AT)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 0 days.

(21) Appl. No.: 16/262,982

(22) Filed: Jan. 31, 2019

(51) Int. Cl.
*H05K 3/40* (2006.01)
*H05K 3/00* (2006.01)
*H01L 21/48* (2006.01)
*H01L 23/498* (2006.01)
*H05K 1/11* (2006.01)

(52) U.S. Cl.
CPC ......... *H05K 3/4038* (2013.01); *H01L 21/486* (2013.01); *H01L 23/49827* (2013.01); *H05K 1/115* (2013.01); *H05K 3/0017* (2013.01); *H05K 3/0094* (2013.01)

(58) Field of Classification Search
CPC .... H05K 3/4038; H05K 1/115; H05K 3/0017; H05K 3/0094; H01L 23/49827; H01L 21/486
USPC ........................................................ 174/262
See application file for complete search history.

(56) References Cited

U.S. PATENT DOCUMENTS

| | | | | |
|---|---|---|---|---|
| 6,211,468 B1* | 4/2001 | Windschitl | ............ | H01L 21/486 174/254 |
| 6,423,934 B2* | 7/2002 | Hasegawa | ................ | B41J 2/162 219/121.68 |
| 2008/0203420 A1* | 8/2008 | Higaki | .................. | H01L 33/486 257/99 |
| 2008/0257591 A1* | 10/2008 | Ikeda | ..................... | H05K 1/119 174/255 |
| 2010/0163297 A1* | 7/2010 | Kajihara | .............. | H05K 3/0032 174/264 |
| 2014/0027163 A1* | 1/2014 | Min | ..................... | H05K 1/0271 174/257 |

* cited by examiner

*Primary Examiner* — Sherman Ng
(74) *Attorney, Agent, or Firm* — Robert A. Blaha; Smith Tempel Blaha LLC (57) ABSTRACT

A method of manufacturing a component carrier is disclosed. The method includes forming a through hole between a first main surface and a second main surface of an electrically insulating layer structure by removing material from at least one of the main surfaces of the electrically insulating layer structure, in particular by irradiating at least one of the main surfaces of the electrically insulating layer structure with at least one laser shot. The at least one main surface from which material is removed, is not covered by an electrically conductive layer structure at least in a surface region in which the through hole is to be formed. Subsequent to formation of the through hole, at least partially filling the through hole and at least partially covering the main surfaces of the electrically insulating layer structure by an electrically conductive filling medium.

18 Claims, 3 Drawing Sheets

FORMING THROUGH HOLES THROUGH EXPOSED DIELECTRIC MATERIAL OF COMPONENT CARRIER

TECHNICAL FIELD

The invention relates to component carriers and methods of manufacturing a component carrier.

TECHNOLOGICAL BACKGROUND

In the context of growing product functionalities of component carriers equipped with one or more electronic components and increasing miniaturization of such components as well as a rising number of components to be mounted on the component carriers such as printed circuit boards, increasingly more powerful array-like components or packages having several components are being employed, which have a plurality of contacts or connections, with ever smaller spacing between these contacts. Removal of heat generated by such components and the component carrier itself during operation becomes an increasing issue. At the same time, component carriers shall be mechanically robust and electrically reliable so as to be operable even under harsh conditions. All these requirements go hand in hand with a continued miniaturization of component carriers and their constituents.

In particular, it may be advantageous to efficiently contact electrically conductive layer structures and/or components mounted on and/or embedded in a component carrier with proper quality. Formation of mechanical vias and laser vias, which may be copper filled, may be advantageous for this and other purposes. However, when forming through holes by laser drilling in a core comprising a dielectric central layer, with two copper foils on both opposing main surfaces thereof, an undesired lateral overhang of the laser patterned copper foils beyond the dielectric central layer with its through hole may be obtained. The term "overhang" may denote a partial length of the electrically conductive layer structure directly adjacent to a respective one of the windows extending through the electrically conductive layer structures over which length the respective portion of the electrically conductive layer structure hangs freely in a cantilever fashion spaced with regard to the electrically insulating layer structure and is not supported from below by material of the electrically insulating layer structure along the extension of the overhang. Such an overhang may result in cracks or voids in the through hole when filled with copper. As a result, the component carrier may have a limited electric reliability.

SUMMARY

There may be a need to manufacture a component carrier with proper electric reliability.

According to an exemplary embodiment of the invention, a method of manufacturing a component carrier is provided, wherein the method comprises forming a through hole (in particular a laser through hole) between a first main surface and a second main surface of an electrically insulating layer structure by removing material from at least one of the main surfaces of the electrically insulating layer structure (in particular by irradiating at least one of the main surfaces of the electrically insulating layer structure with at least one laser shot), wherein the at least one main surface from which material is removed (in particular which is to be irradiated) is not covered by an electrically conductive layer structure at least in a surface region in which the through hole is to be formed, and subsequently at least partially filling the through hole and at least partially covering the main surfaces of the electrically insulating layer structure by an electrically conductive filling medium.

According to another exemplary embodiment of the invention, a method of manufacturing a component carrier is provided, wherein the method comprises providing an electrically insulating layer structure with a thickness of less than 110 μm and having a first main surface and a second main surface, and forming a through hole extending through the electrically insulating layer structure between the first main surface and the second main surface, wherein the through hole is formed (in particular with one or more laser shots only from one main surface of the electrically insulating layer structure but not from the other main surface, or with one or more laser shots from the first main surface and one or more further laser shots from the second main surface; in particular the formation of the laser through hole with only one laser shot only from one main surface only, which may also result in a first partial hole and a second partial hole having different values of roughness) with a first partial hole extending from the first main surface into the electrically insulating layer structure, with a second partial hole extending from the second main surface into the electrically insulating layer structure, and with a lateral offset between a central axis of the first partial hole and a central axis of the second partial hole being less than 3 μm (in particular less than 1 μm), wherein the method may optionally comprise at least partially filling the through hole and/or at least partially covering the main surfaces of the electrically insulating layer structure by an electrically conductive filling medium.

According to another exemplary embodiment of the invention, a method of manufacturing a component carrier is provided, wherein the method comprises providing an electrically insulating layer structure having a first main surface and a second main surface, forming a through hole extending through the electrically insulating layer structure between the first main surface and the second main surface, at least partially filling the through hole by an electrically conductive filling medium comprising a first number of multiple stacked structures, and forming at least one electrically conductive track partially covering at least one of the main surfaces of the electrically insulating layer structure and comprising a second number of multiple stacked structures, wherein a difference between the first number and the second number is zero or one, wherein in particular the first number is three or four and/or the second number is three.

According to another exemplary embodiment of the invention, a component carrier is provided which comprises an electrically insulating layer structure having a first main surface and a second main surface, a through hole extending through the electrically insulating layer structure between the first main surface and the second main surface, and an integral electrically conductive structure covering sidewalls of the through hole extending up to (and for instance continuously along) one or both of the main surfaces and covering at least part of the main surfaces of the electrically insulating layer structure.

According to another exemplary embodiment of the invention, a component carrier is provided which comprises an electrically insulating layer structure with a thickness of less than 110 μm and having a first main surface and a second main surface, a through hole (which may be optionally at least partially filled with an electrically conductive filling medium, as described herein) extending through the electrically insulating layer structure between the first main surface and the second main surface, wherein the through hole has a first partial hole extending from the first main surface into the electrically insulating layer structure, and a second partial hole extending from the second main surface into the electrically insulating layer structure, wherein a lateral offset between a central axis of the first partial hole and a central axis of the second partial hole is less than 3 µm, in particular is less than 1 µm.

According to another exemplary embodiment of the invention, a component carrier is provided which comprises an electrically insulating layer structure having a first main surface and a second main surface, a through hole extending through the electrically insulating layer structure between the first main surface and the second main surface, an electrically conductive filling medium (which may have the properties as described herein) at least partially filling the through hole and comprising a first number of multiple stacked structures (such as a plating layer, a bridge structure, a first bulk structure and a second bulk structure), and at least one electrically conductive track partially covering at least one of the main surfaces of the electrically insulating layer structure and comprising a second number of multiple stacked structures (such as a plating layer, a bridge structure, and a first bulk structure or a second bulk structure), wherein a difference between the first number and the second number is zero or one (wherein the first number may in particular be three or four, and the second number may in particular be three).

OVERVIEW OF EMBODIMENTS

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above-mentioned types of component carriers.

In the context of the present application, the term "layer structure" may particularly denote a continuous layer, a patterned layer or a plurality of non-consecutive islands within a common plane.

In the context of the present application, the term "through hole" may particularly denote a hole extending vertically through the entire electrically insulating layer structure, and which may be formed in particular by laser processing (wherein formation of the through hole by a plasma process or the like is possible as well). Thus, the through hole may be a laser through hole in one embodiment. More specifically, such a through hole may be a through hole having tapering portions on two opposing main surfaces of the electrically insulating layer structure, for instance as a result from the energy impact of laser beams which are irradiated onto one or both of the two opposing main surfaces of the electrically insulating layer structure.

In the context of the present application, the term "integral electrically conductive structure" may particularly denote a continuous structure of electrically conductive material (in particular copper, more particularly plated copper) having homogeneous material properties and being distinguishable (in particular when inspecting a cross-section of the component carrier) from other constituents of the component carrier, in particular from adjacent electrically conductive material. A skilled person is aware of the fact that a plated integral electrically conductive structure lining at least part of sidewalls of the through hole and at least part of main surfaces of an electrically insulating layer structure can be visually distinguished or separated from other electrically conductive material, such as another plating structure, another structure formed by electroless deposition, a metal foil, etc. Thus, the entire electrically conductive material of the integral electrically conductive structure may relate to and may belong to the whole integral electrically conductive structure, in particular without intrinsic interfaces or discontinuities or material transitions.

According to an exemplary embodiment of the invention, a manufacturing method for manufacturing a component carrier with a through hole being partly or entirely filled with electrically conductive material is provided, wherein the electric reliability of the filled through hole is highly advantageous. In such an embodiment, a dielectric layer structure (such as a core layer, i.e. fully cured dielectric material without copper) comprising one or multiple through holes is provided which does not suffer from overhang and related phenomena as a result of lacking electrically conductive layer structures covering the dielectric layer structure at least during through hole drilling and/or at least in a drilling region. According to such a concept, a dielectric body being free of electrically conductive material on one or even both opposing main surfaces may be directly irradiated with one or more laser beams (or may be treated in another appropriate way) for forming a through hole. Thus, an exposed electrically insulating layer structure may be directly made subject of laser drilling or another material removal procedure, rather than covering it with electrically conductive material prior to laser drilling or the other material removal procedure through the covering electrically conductive material. As a result of the omission of electrically conductive material on a surface of an electrically insulating layer structure during laser drilling or the like, there is no risk of the formation of undesired overhang or bottle holes. In particular what concerns thin core layers, such a manufacturing method may also largely prevent a front side to back side offset. Thus, a simply manufacturable and highly reliably component carrier with a homogeneous copper layer structure may be obtained. Further advantageously, such a copper filled via may also be not prone to mechanical failure even when significant temperature changes/thermal cycles impact the component carrier. Thus, a high electrical reliability, a high mechanical reliability and a high thermal reliability of the component carrier may be advantageously obtained by the mentioned concept of forming through holes in a purely dielectric layer structure.

According to another exemplary aspect, it may be advantageously possible to (in particular partially or entirely simultaneously, or sequentially) form an electrically conductive filling medium in the through hole and one or more electrically conductive tracks on one or both of the opposing main surfaces of the electrically insulating layer structure with numbers of sublayers differing by one. It may also be possible to form at least part of the tracks on an electrically conductive layer structure (such as a copper foil) which may be present at least temporarily and/or at least partially on the electrically insulating layer structure. Alternatively, the electrically conductive filling medium in the through hole and the one or more tracks may have the same number of sublayers (for instance when applying a semi-additive processing and patterning procedure). This is a very efficient mechanism of simultaneously plating a through hole and forming an electrically conductive wiring on the main surfaces of the dielectric layer.

In the following, further exemplary embodiments of the component carriers and the methods will be explained.

In particular, the method may comprise forming the through hole in the electrically insulating layer structure while one or both of the main surfaces of the electrically insulating layer structure is or are not covered by an electrically conductive layer structure. In such an embodiment, the laser beam forming the through hole may directly impact and may directly remove material from an exposed dielectric surface area of the electrically insulating layer structure without previously propagating through electrically conductive material. Thus, the through hole may be drilled directly through the electrically insulating layer structure alone. Since this procedure involves no lateral overhang of an electrically conductive layer structure beyond the electrically insulating layer structure at all, a high reliability can be obtained in such an embodiment.

In an embodiment, forming the through hole comprises irradiating the first main surface, being not covered by an electrically conductive layer structure, with a first laser shot (which may be exactly one first laser shot or a plurality of first laser shots) and irradiating the second main surface, being not covered by an electrically conductive layer structure, with a second laser shot, in particular exactly one second laser shot. Thus, the electrically insulating layer structure may be exposed at the point of time where the respective laser shot is irradiated onto the respective main surface of the electrically insulating layer structure. No electrically conductive layer structure, and in particular no metal foil, covers the electrically insulating layer structure at this point of time. As a result, there is no issue with overhang which can conventionally result in the formation of cracks. Furthermore, the mentioned approach is very simple.

In an embodiment, forming the through hole comprises irradiating the first main surface, being not covered by an electrically conductive layer structure, with a first laser shot (which may be exactly one first laser shot or a plurality of first laser shots) and irradiating the second main surface, being not covered by an electrically conductive layer structure, with (in particular at least or exactly) two second laser shots. A relatively homogeneous geometry of the through hole extending through the electrically insulating layer structure may be obtained by laser drilling from both opposing main surfaces of the uncovered dielectric surface area of the electrically insulating layer structure.

In another embodiment, forming the through hole comprises irradiating the electrically insulating layer structure only from the first main surface, not from the second main surface. In particular, the first main surface may be laser drilled with one or multiple laser shots. Depending on the parameters used for laser drilling only from one side of the electrically insulating layer structure, the laser through hole may have a straight geometry or may have a frustoconical geometry. This is a very simple and fast approach of forming laser through holes. In a panel or an array comprising a set of component carriers during manufacture, it may be necessary to form more than 100,000 or even more than 1 million laser-generated through holes per panel or array.

In an embodiment, the at least one main surface to be irradiated is entirely not covered at all by an electrically conductive layer structure during the irradiating. For instance, a purely dielectric layer structure without any surface metal may be irradiated with the laser beam(s).

In another embodiment, the at least one main surface to be irradiated is, during the irradiating, covered only partially by an electrically conductive layer structure in a surface region of the at least one main surface which surface region is not to be irradiated by the at least one laser shot. In other words, a main surface to be irradiated with a laser beam may be at least partially covered with electrically conductive material, wherein however a target portion of the respective main surface, which target surface is to be irradiated with a laser beam, is free of electrically conductive material already before switching on the laser beam for irradiation of this target surface. For instance, the surface region being free of electrically conductive material may be larger than an exterior area of the through hole at the corresponding main surface of the electrically insulating layer structure.

In particular, the method may comprise, before the irradiating, forming an electrically conductive layer structure on the at least one main surface to be irradiated, and subsequently but still before the irradiating starts, removing part of the electrically conductive layer structure at least in a surface portion of the at least one main surface which is to be irradiated by the at least one laser shot. For instance, electrically conductive material covering the main surface to be irradiated may be partially etched away, may be removed mechanically, etc., before switching on the laser beam for irradiation of this target surface.

Advantageously, formation of through holes in copperless surfaces may reduce mechanical tensions or stress (and in particular warpage) at the panel. Without wishing to be bound to a specific theory, it is presently believed that such mechanical tensions or stress and in particular warpage may be unintentionally created by a punctual heating of a copper layer adjacent to a laser bore.

In an embodiment, forming the through hole comprises directly irradiating at least one of the exposed main surfaces of the electrically insulating layer structure with the at least one laser shot. In the context of the present application, the term "directly irradiating" may particularly denote that the directly irradiated electrically insulating layer structure is exposed at the time of irradiation without being covered with metallic material. This avoids issues such as overhang and improves the electric reliability of the obtained component carrier.

In an embodiment, the method comprises forming at least part of the electrically conductive filling medium by forming a plating layer, in particular having a substantially homogeneous thickness, as an integral structure covering at least part of sidewalls of the through hole and at least partially covering the main surfaces. Formation of this plating layer may follow the optional previous formation of a seed layer. During the manufacturing process, it may be possible to firstly cover the sidewalls of the through hole with a thin seed layer of electrically conductive material (preferably copper), for instance by electroless deposition. Subsequently, the plating structure may be formed by a plating procedure, for instance by galvanic plating. During such a plating procedure, the sidewalls may be covered with a thicker layer of electrically conductive material. Thus, the plating layer may be composed of a seed layer being covered with further plated material. After having formed an optional thin seed layer covering the sidewalls (for in-stance having a thickness in the range between 0.1 µm and 5 µm, for instance 1 µm) of electrically conductive material such as copper, a substantial amount of electrically conductive material (preferably copper) may be formed on this seed layer preferably by plating or galvanic deposition (for instance with a thickness in the range between 6 µm and 30 µm). It is possible that the seed layer is a single layer and/or that several cumulative seed layers are provided. When multiple seed layers are provided, they may comprise an organic (for instance polymer) layer, a palladium layer, a titanium layer and/or a copper layer. Also, other adhesion promoting materials may be used, preferably covered by copper. In an embodiment, it is also possible to form the seed layer or part thereof by PVD (physical vapor deposition) techniques like sputtering.

In an embodiment, the plating layer may be an annular plating layer. In the context of the present application, the term "annular plating layer" may particularly denote a plating layer with the shape of an annulus or a ring. An annular plating layer may therefore be circumferentially closed and may have a through hole extending vertically therethrough. The annular plating layer may be formed partially on the sidewalls and partially on the top and bottom main surfaces of the electrically insulating layer structure, either directly on the electrically insulating layer structure or separated by a seed layer or the like. A vertically continuous portion of the laser through hole may remain open after having formed the annular plating layer. It has turned out that by plating sidewalls of the electrically insulating layer structure delimiting the through hole and at least part of top and bottom walls of the electrically insulating layer structure by a separate annular plating layer, crack formation can be significantly suppressed and electric reliability of the electrically conductive filling of the laser through hole may be improved.

In an embodiment, the method comprises forming, in particular by plating, a further part of the electrically conductive filling medium by forming an electrically conductive bridge structure on the plating layer and connecting opposing sidewalls of the electrically insulating layer structure delimiting the through hole. Correspondingly, the component carrier may comprise an electrically conductive bridge structure, in particular being substantially H-shaped, on the plating layer and connecting opposing sidewalls of the electrically insulating layer structure delimiting the through hole. In the context of the present application, the term "bridge structure" may particularly denote an electrically conductive structure extending substantially horizontally between opposing sidewalls of the electrically insulating layer structure and delimiting the through hole, in particular at or close to a narrowest portion of the through hole. For instance, such a bridge structure can be formed by plating following through hole formation and following formation of the above-mentioned plating layer. After such a plating procedure, the previously formed through hole may be only partially filled with electrically conductive material constituting the bridge structure, so that the bridge structure is delimited in an upward direction by a first demarcation surface and at a lower side by a second demarcation surface. Both the first demarcation surface and the second demarcation surface may have a concave shape. The above procedure of forming the plating layer may thus be followed by the formation of a connection between the side-walls with plating material in form of the bridge structure, in many cases at or close to a narrowest portion of the through hole. Thus, a substantially H-shaped bridge structure with a horizontal bridge part and slanted legs on the plating layer may be obtained.

In an embodiment, the component carrier comprises a first electrically conductive bulk structure filling at least part of a volume above the first demarcation surface, i.e. filling at least part of a dimple above the first demarcation surface. In an embodiment, the component carrier comprises a second electrically conductive bulk structure filling at least part of a volume below the second demarcation surface, i.e., filling at least part of a dimple below the second demarcation surface. Correspondingly, the method may comprise forming a first electrically conductive bulk structure filling at least part of a volume between the first demarcation surface and the first main surface and/or a second electrically conductive bulk structure filling at least part of a volume between the second demarcation surface and the second main surface. After having completed a plating procedure of forming the bridge structure, remaining empty spaces within the through hole above the first demarcation surface and/or below the second demarcation surface may be filled partially or entirely with further electrically conductive material such as copper. This filling is denoted as a first and a second electrically conductive bulk structure. Preferably, such electrically conductive bulk structures may be formed in plating procedures being separate from a plating procedure of forming the bridge structure. As known by those skilled in the art of component carrier manufacture, a transition between the bridge structure and the bulk structures can be seen in a cross-sectional view of a manufactured component carrier. Thus, the bridge structure on the one hand and the bulk structures on the other hand can be visually separated in a cross-sectional view of the component carrier.

In an embodiment, at least one of the first electrically conductive bulk structure and the second electrically conductive bulk structure is a plating structure. Correspondingly, the method may comprise forming at least one of the group consisting of the first electrically conductive bulk structure and the second electrically conductive bulk structure by a further plating procedure following at least one previous plating procedure of forming the bridge structure.

In an embodiment, the method comprises forming a bonding layer, in particular having a substantially homogeneous thickness, between at least part of the sidewalls and at least part of the main surfaces, on the one hand, and the plating layer on the other hand. Correspondingly, the component carrier may comprise at least one bonding layer, in particular having a substantially homogeneous thickness, between at least part of the sidewalls and at least part of the main surfaces, on the one hand, and the integral electrically conductive structure on the other hand. Such a bonding layer may improve adhesion between the electrically insulating layer structure and the plating layer and may improve the mechanical reliability of the component carrier.

In an embodiment, forming the through hole, in particular by laser shots irradiated onto the electrically insulating layer structure from both opposing main surfaces, is carried out with a uniform laser energy. It has turned out that a substantially constant laser energy or power during front side drilling and back side drilling improves the homogeneity of the geometry of the through hole and has a positive impact on the electric reliability of the component carrier.

In an embodiment, the method comprises forming at least one electrically conductive track comprising a stack of multiple plated structures on the electrically insulating layer structure (at least partially) simultaneously with the formation of the electrically conductive filling medium. For instance, the stack may be formed at least partially by semi-additive processing. Correspondingly, the plating layer, the bridge structure and the at least one bulk structure may be patterned so as to form at least one laterally delimited further layer stack on at least one of the first main surface and the second main surface. This may be accomplished by forming at least one resist before and/or between and/or after forming different constituents of the electrically conductive filling medium, if desired combined with corresponding patterning or etching procedures. As a consequence, the formation of electrically conductive tracks and plating of one or more laser through holes may be carried out simultaneously. This keeps the effort of manufacturing component carriers small and reduces waste. By depositing and patterning a resist on surfaces of the electrically insulating layer structure and/or on the electrically conductive filling medium, the geometry of the tracks may be properly defined.

In an embodiment, the at least one laterally delimited further layer stack and/or a part (which may be denoted as a protruding stack) of the plating layer, the bridge structure and the at least one bulk structure extending vertically beyond the through hole have sidewalls having an angle with a respective one of the first main surface or the second main surface in a range between 85° and 95°, more particularly in a range between 89° and 91°. Preferably, the angle may be a right angle, i.e. an angle of 90°. Such an angular characteristic is a fingerprint of semi-additive processing. In contrast to this, formation of the mentioned stacks by etching may result in stronger slanted sidewalls.

In an embodiment, no electrically conductive layer structure (and in particular no copper foil) is arranged between the integral electrically conductive structure and the main surfaces. This structural feature is a finger-print of the formation of the through hole without coverage of the main surfaces with electrically conductive material.

In an embodiment, the integral electrically conductive structure continuously lines the sidewalls and at least part of the main surfaces. In particular, also an angled transition between the sidewalls and the main surfaces may be continuously (in particular fully circumferentially at both opposing main surfaces) covered with the integral electrically conductive structure. The integral electrically conductive structure may constitute the plating layer and may be formed of a continuous electrically conductive material, such as copper. The integral electrically conductive structure may have a substantially homogeneous thickness. It may cover at least part of sidewalls of the through hole and may at least partially cover the main surfaces.

In an embodiment, a minimum vertical thickness of the bridge structure is at least 20 μm, in particular at least 25 μm. Experiments have shown that when the smallest vertical thickness of the bridge structure over the entire width thereof is at least 20 μm or preferably at least 25 μm, reliability can be further improved.

It may also be advantageous to keep the minimum thickness of the bridge structure smaller than 40 μm. It has also been surprisingly found that when the vertical thickness of the bridge structure becomes too large, dimples or concave surfaces delimiting the bridge structure as an upper demarcation surface and a lower demarcation surface may become excessively shallow. This may cause issues when subsequently filling one or both dimples with electrically conductive material (such as copper) by plating, since it may have the tendency to cause an undesired shape of the copper filled laser via. Therefore, it may be preferred that also an upper limit of the narrowest vertical thickness of the bridge structure of not more than 40 μm is respected.

In an embodiment, a roughness Rz of at least part of the sidewalls in a first tapering portion (which may extend from the first main surface) of the through hole is different from a roughness Rz of at least part of the side-walls in a second tapering portion (which may extend from the second main surface) of the through hole. Rz can be determined when a reference length is sampled from a roughness curve in a direction of a mean line, and may denote the distance between the top profile peak line and the bottom profile valley line on this sampled portion as measured in the longitudinal direction of the roughness curve. In particular, the roughness Rz of at least part of the sidewalls in the first tapering portion may be smaller than the roughness Rz of at least part of the sidewalls in the second tapering portion, and a vertical extension of the first tapering portion may be larger than a vertical extension of the second tapering portion. A smoother larger surface area of the first tapering portion may thus be advantageously combined with a rougher smaller surface area of the second tapering portion to ensure continuously a proper adhesion of electrically conductive filling medium on the sidewalls of the electrically insulating layer structure delimiting the through hole.

In an embodiment, a thickness of the electrically insulating layer structure is not more than 110 μm, in particular not more than 60 μm. In particular with relatively thin electrically insulating layer structures, i.e., having a thickness of less than 180 μm or even 110 μm or less, reliability concerning the electrically conductive filling of through holes becomes more and more an issue. However, when the design rules mentioned herein are expected, it has turned out that even for such thin core layers, a proper reliability of a component carrier may be obtained.

In an embodiment, the electrically insulating layer structure is a prepreg layer, in particular a fully cured prepreg layer consisting of dielectric material. Such a prepreg layer may be substantially fully cured, i.e. may comprise resin which is substantially no more able to cross-link but is already highly or completely cross-linked. C-stage resin may or may not be 100% crosslinked polymer chains, but may at least have a network of highly crosslinked polymer chains, so that the final product cannot be thermally reformed and is insoluble. As a consequence, such a material will not re-melt or become flowable again during a subsequent lamination procedure in which one or more electrically conductive layer structures and/or electrically insulating layer structures may be laminated on the top surface and/or the bottom surface of the prepreg layer with copper filled through hole(s) during build-up. For instance, such a prepreg layer may comprise resin including reinforcing particles such as glass fibres or glass spheres.

In an embodiment, at least a part of the through hole is substantially X-shaped. In particular, the through hole may have a first tapering portion extending from the first main surface and a second tapering portion extending from the second main surface. A through hole having such a shape may be formed by carrying out a first laser drilling from the first main surface with only one laser shot and carrying out a second laser drilling from the second main surface with only one further laser shot. Thus, a substantial X-shape may be the fingerprint of a manufacturing procedure of forming the through hole using a single laser shot from the front side and a single laser shot from the back side.

In another embodiment, at least a part of the through hole has a central (for instance substantially cylindrical) section between two opposing tapering sections. A through hole having such a shape may be formed by carrying out a first laser drilling from the first main surface with (for instance only) one laser shot and carrying out a second laser drilling from the second main surface with (in particular exactly) two laser shots. A correspondingly formed through hole may comprise a central connection portion connecting the first tapering portion with the second tapering portion. Thus, the shape of the through hole may have a for instance straight or substantially straight central connection portion between two opposing tapering portions at the upper and lower end of the through hole. The horizontal portion of the bridge structure may then be formed at least partially in this central connection portion. Such a geometry may be obtained by combining a single laser shot from the first upper main surface with two subsequent laser shots from the second main surface.

In yet another embodiment, the laser through hole may also have a frustoconical shape or even a substantially straight shape. This can be adjusted by correspondingly configuring the number of laser shots, their energy, their duration, and/or other parameters in terms of laser drilling.

In an embodiment, a lateral offset between a center of the first tapering portion and a center of the second tapering portion is not more than 3 μm. In an ideal case (which is however difficult to manufacture for each and every of a large plurality of through holes in a component carrier), there is no offset at all. In the context of the present application, the term "offset" may particularly denote a spatial mismatch or lateral displacement between a respective center of laser beams and/or a respective center of partial holes in the electrically insulating layer structure formed by a laser beam on the front side and on the back side of the electrically insulating layer structure. More specifically, the term "offset" may refer to a spatial distance between the mentioned centers when comparing them at the front side with the back side. The presence of such an offset may be the consequence of a process of manufacturing a through hole in an electrically insulating layer structure. In the context of such a process, the electrically insulating layer structure may firstly be made subject to a first laser processing from the front side, then the electrically insulating layer structure may be flipped or turned around by 180°, and subsequently a second laser treatment of the electrically insulating layer structure is accomplished from its back side. Due to a spatial mismatch with regard to a mutual alignment between laser source and electrically insulating layer structure during front side and back side laser processing, the mentioned offset may occur. When measures are taken for keeping the offset low (for instance clamping a panel or another pre-form of the component carrier during laser drilling from the front side and from the back side, proper alignment using alignment markers, suppression of warpage of a panel or another pre-form of the component carrier), this low offset value also results in a high reliability of the obtained component carrier.

In an embodiment, the electrically conductive bridge structure is delimited by a first demarcation surface facing towards the first main surface and by a second demarcation surface facing towards the second main surface, wherein a distance between, on the one hand, a point on the side wall at which a width of the through hole is minimum, and, on the other hand, a lowermost point of the first demarcation surface and/or an uppermost point of the second demarcation surface is at least 20 μm. If this highly advantageous design rule is respected according to a preferred embodiment of the invention, a void-free and crack-free copper filled laser via can be obtained, since it ensures good properties of the copper filling at the critical position of the bridge structure at the bottleneck of the through hole. Descriptively speaking, a sufficient amount of electrically conductive material in the mentioned region is advantageous for ensuring reliability.

In an embodiment, the electrically conductive bridge structure is delimited by the first demarcation surface facing towards the first main surface and by the second demarcation surface facing towards the second main surface. A central bridge plane may be defined to extend parallel to the first main surface and the second main surface and through a vertical center between a lowermost point of the first demarcation surface and an uppermost point of the second demarcation surface. A first intersection point may be defined as a first intersection between the central bridge plane and one of the sidewalls of the electrically insulating layer structure. Advantageously, a length of a shortest distance (in particular of a first perpendicular) from the first intersection point to the first demarcation surface may be at least 20 μm. In the context of the present application, the term "central bridge plane" may particularly denote a virtual plane with a horizontal extension that is parallel to the two opposing main surfaces of the electrically insulating layer structure, and extends at a height level in the middle between a lowermost point of the first demarcation surface and an uppermost point of the second demarcation surface. In the context of the present application, the central bridge plane is considered for defining a minimum distance rule according to an exemplary embodiment of the invention. In the context of the present application, the term "intersection point" is introduced as a virtual point used for formulating the minimum distance design rule according to an exemplary embodiment of the invention. The respective intersection point is defined as a virtual intersection between the before mentioned central bridge plane and one of the sidewalls of the electrically insulating layer structure delimiting the through hole in a cross-sectional view. In the context of the present application, the term "a perpendicular" may particularly denote a straight line extending from a respective intersection point up to a respective demarcation surface and intersecting this demarcation surface so that a right angle is formed between the straight line and a tangent (in particular a tangent plane) on the curved demarcation surface at a position of an intersection between the straight line and the demarcation surface. In other words and descriptively speaking, the perpendicular may correspond to a shortest connection line between the intersection point and the demarcation surface, and may intersect the latter at a right angle. It has been surprisingly found that when fulfilling the mentioned specific design rule for the bridge structure filling part of the through hole of a component carrier, the electric and mechanical reliability of the obtained component carrier is high. This means that undesired phenomena such as cracks in the electrically conductive filling medium filling the through hole and/or voids remaining in an interior of the through hole filled with electrically conductive material can be reliably prevented or at least strongly suppressed when meeting this design rule. More specifically, the mentioned design rule relates to the fact that a shortest distance between a sidewall of the through hole at the vertical level of a central plane of the bridge structure and a respective demarcation surface delimiting the bridge structure should be preferably at least 20 μm. Although it is preferable that this design rule is fulfilled for both or all intersection points between the sidewalls and the central plane on the one hand and both demarcation surfaces on the other hand, good results have already been obtained when fulfilling this design rule already for one intersection point and one demarcation surface.

In an embodiment, the component carrier comprises a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure and/or thermal energy. The mentioned stack may provide a plate-shaped component carrier capable of providing a large mounting surface for further components and being nevertheless very thin and compact.

In an embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

In an embodiment, the component carrier is configured as one of the group consisting of a printed circuit board, a substrate (in particular an IC substrate), and an interposer.

In the context of the present application, the term "printed circuit board" (PCB) may particularly denote a plate-shaped component carrier which is formed by laminating several electrically conductive layer structures with several electrically insulating layer structures, for instance by applying pressure and/or by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing structures (such as glass fibers or glass spheres).

In the context of the present application, the term "substrate" may particularly denote a small component carrier having substantially the same size as a component (in particular an electronic component to be mounted thereon. More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing particles (such as reinforcing spheres, in particular glass spheres).

The substrate or interposer may comprise or consist of at least a layer of glass, silicon (Si) or a photoimageable or dry-etchable organic material like epoxy-based build-up material (such as epoxy-based build-up film) or polymer compounds like polyimide, polybenzoxazole, or benzocyclobutene.

In an embodiment, the at least one electrically insulating layer structure comprises at least one of the group consisting of resin (such as reinforced or non-reinforced resins, for instance epoxy resin or bismaleimide-triazine resin, more specifically FR-4 or FR-5), cyanate ester, polyphenylene derivate, glass (in particular glass fibers, glass-spheres, multi-layer glass, glass-like materials), prepreg material, photoimageable dielectric material, polyimide, polyamide, liquid crystal polymer (LCP), epoxy-based build-up material, polytetrafluoroethylene (teflon), a ceramic, and a metal oxide. Reinforcing materials such as webs, fibers or spheres, for example made of glass (multilayer glass) may be used as well. Although prepreg, FR4, or epoxy-based build-up film or photoimageable dielectrics are usually preferred, other materials may be used as well. For high-frequency applications, high-frequency materials such as polytetrafluoroethylene, liquid crystal polymer and/or cyanate ester resins may be implemented in the component carrier as electrically insulating layer structure.

In an embodiment, at least one of the integral electrically conductive structure, the bridge structure, the at least one bulk structure, and one or more optional electrically conductive layer structures comprises at least one of the group consisting of copper, aluminum, nickel, silver, gold, palladium, and tungsten. Although copper is usually preferred, other materials or coated versions thereof are possible as well, in particular coated with a supra-conductive material such as graphene.

At least one component may be surface mounted on and/or embedded in the component carrier and can in particular be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an electronic component, or combinations thereof. For example, the component can be an active electronic component, a passive electronic component, an electronic chip, a storage device (for instance a DRAM or another data memory), a filter, an integrated circuit, a signal processing component, a power management component, an optoelectronic interface element, a light-emitting diode, a photocoupler, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element, a multiferroic element or a ferrimagnetic element, for instance a ferrite core) or may be a paramagnetic element. However, the component may also be a substrate, an interposer or a further component carrier, for example in a board-in-board configuration. The component may be surface mounted on the component carrier and/or may be embedded in an interior thereof. Moreover, also other components, in particular those which generate and emit electromagnetic radiation and/or are sensitive with regard to electro-magnetic radiation propagating from an environment, may be used as component.

In an embodiment, the component carrier is a laminate-type component carrier. In such an embodiment, the component carrier is a compound of multiple layer structures which are stacked and connected together by applying a pressing force and/or heat.

The aspects defined above and further aspects of the invention are apparent from the examples of embodiment to be described hereinafter and are explained with reference to these examples of embodiment.

DETAILED DESCRIPTION OF ILLUSTRATED EMBODIMENTS

The illustrations in the drawings are schematically presented. In different drawings, similar or identical elements are provided with the same reference signs.

Before referring to the drawings, exemplary embodiments will be described in further detail, some basic considerations will be summarized based on which exemplary embodiments of the invention have been developed.

According to an exemplary embodiment, one or both main surfaces of an electrically insulating layer structure may remain exposed and uncovered by electrically conductive layer structures at the time of forming one or more through holes extending through the electrically insulating layer structure by laser drilling. Thus, a manufacturing method relating to such an embodiment comprises forming the through hole(s) in the electrically insulating layer structure without covering the main surfaces of the electrically insulating layer structure with an electrically conductive layer structure, such as a copper foil. In embodiment, a laser through hole may thus be formed without copper on surfaces of a core made subject to laser drilling.

Conventionally, the starting point of manufacturing a printed circuit board (PCB) or a substrate is a core comprising an insulating layer structure, covered with copper layers on both surfaces. Before creation of structures and the first build-up layer, laser through holes are created for aligning and electrically connecting the two copper layers of the core. However, there are several drawbacks of such a conventional technology:

Firstly, due to the heat of the laser beam, the resin below the copper near to the opening is melting and thus a so-called overhang may be created. An overhang is critical, as during the plating-process, voids can be created which might lead to cracks.

Secondly, through holes have to be created by drilling from both sides. Due to machine tolerances, a significant shift from the two sides (front-back shift or offset) cannot be avoided.

Thirdly, especially when working with thin cores (in particular cores having a thickness less than 110 μm) so-called bottle holes can be created by the laser by irradiating the copper-layer on the ground. If the copper-layer is irradiated, it cannot be processed by laser from the other side anymore.

Figure 6:
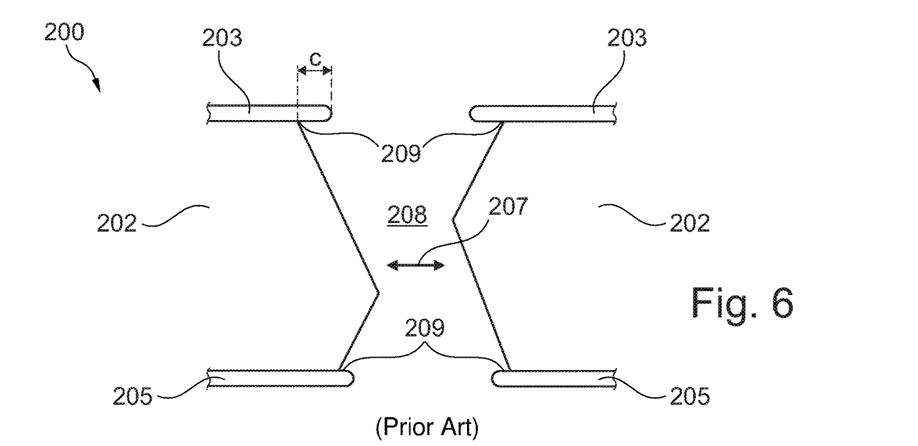
FIG. 6 and FIG. 7 illustrate cross-sectional views of conventional component carriers with through hole.

FIG. 6 shows a conventional component carrier 200 with a through hole 208 suffering from a significant overhang 209 and suffering from front to back side offset 207. Exemplarily, the overhang 209 at the upper left-hand side of FIG. 6 is denoted with reference character c. According to FIG. 6, the through hole 208 is formed in a layer stack composed of a central dielectric core 202 covered on both opposing main surfaces with a respective patterned copper foil 203, 205. Due to the excessive offset 207 and the significant overhang 209, a high risk of cracks and voids occurs when the through hole 208 is filled with plated copper (not shown).

Figure 7:
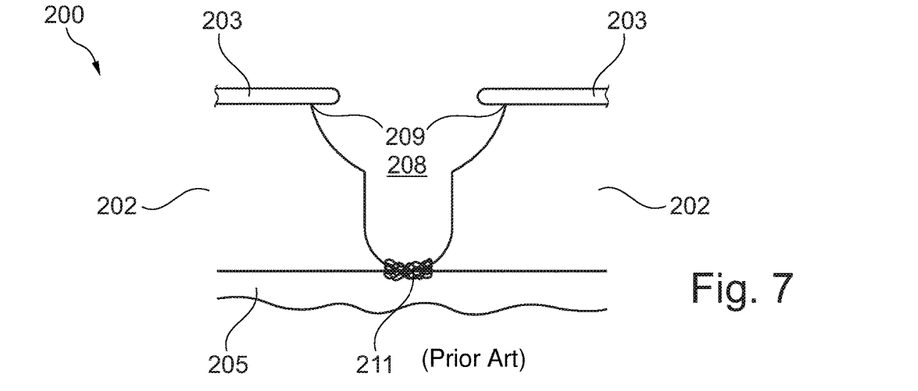

FIG. 7 shows another conventional component carrier 200 with a bottle hole. Reference numeral 211 illustrates laser irradiated copper. A resulting reflection of the laser light in an upward direction increases the overhang 209 and results in severe reliability issues.

In contrast to the conventional approaches according to FIG. 6 and FIG. 7 and according to an exemplary embodiment of the invention, a component carrier having a core layer comprising through holes is provided without suffering from overhang and bottle holes, and which, in particular in terms of thin core layers, may also prevent an excessive offset.

A corresponding manufacturing process according to an exemplary embodiment can be as follows: a starting point may be providing a purely dielectric electrically insulating layer, for instance FR4, preferably without any metal. Then, laser through holes may be drilled in the dielectric electrically insulating layer, preferably with uniform laser energy and power to prevent glass protrusion, bottom undercut and winking (i.e. removal of resin from glass). In contrast to this, when creating laser through holes in copper cores, laser energy and power has to be changed among the laser shots to prevent bottle holes.

When using thin core layers (in particular consisting only of dielectric material), it can be possible to shoot with a laser beam from only one side. Then, any offset can be prevented and as a consequence the density of connections can be increased.

Figure 1:
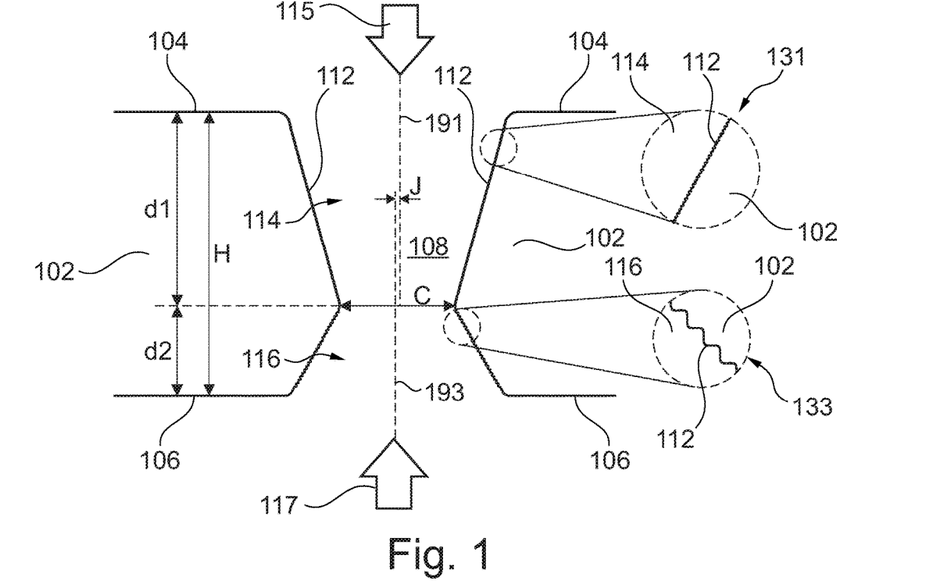
FIG. 1, FIG. 2 and FIG. 3 illustrate cross-sectional views of structures obtained during performance of a method of manufacturing a component carrier with a through hole by a multiple laser shot treatment from opposing sides and by subsequently filling the through hole with electrically conductive filling medium according to an exemplary embodiment of the invention.
Figure 2:
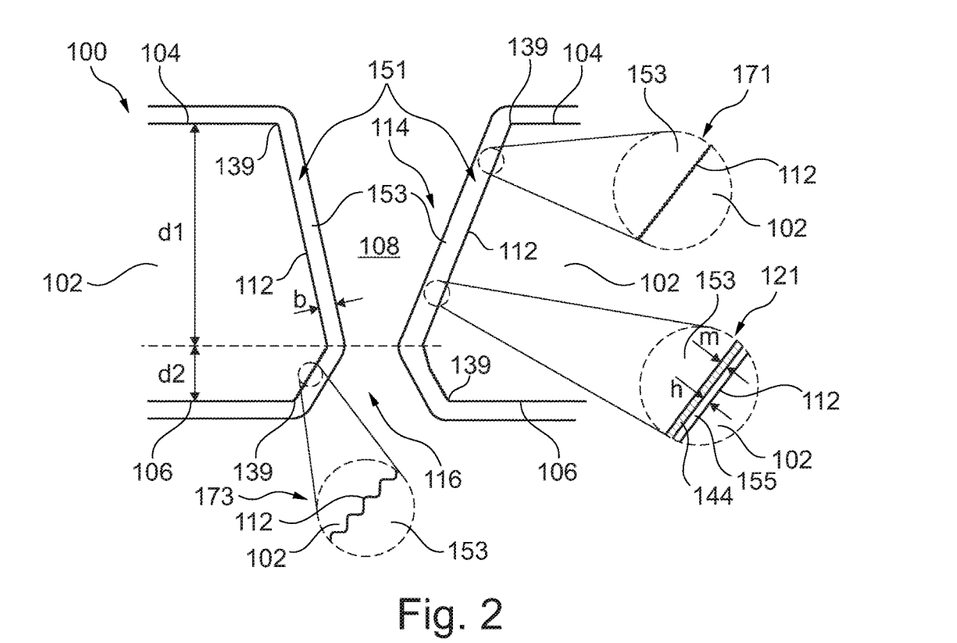
Figure 3:
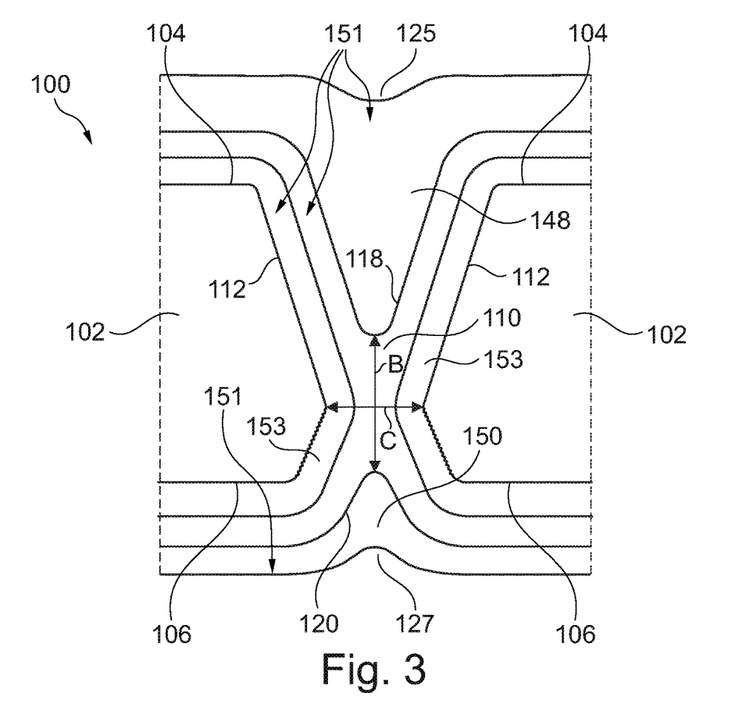

FIG. 1 to FIG. 3 illustrate cross-sectional views of structures obtained during performance of a method of manufacturing a component carrier 100, shown in FIG. 3, with a through hole 108 by a multiple laser shot treatment from opposing sides and by subsequently filling the through hole 108 with an electrically conductive filling medium 151 formed by multiple filling procedures according to an exemplary embodiment of the invention.

Referring to FIG. 1, a first part of the through hole 108 extending between a first main surface 104 and a second main surface 106 of an electrically insulating layer structure 102 is formed by carrying out a first laser shot 115. Laser processing as described referring to FIG. 1 may be carried out by an appropriate laser source, for instance by an excimer laser and/or a carbon dioxide laser. In the shown embodiment, the electrically insulating layer structure 102 may comprise resin (in particular epoxy resin, optionally comprising reinforcing particles such as glass fibers or glass particles. A vertical thickness H of the electrically insulating layer structure 102 may for instance be not more than 110 μm, in particular in a range between 40 μm and 60 μm.

A blind hole is formed by the first laser shot 115 in the upper main surface 104 of the electrically insulating layer structure 102. The blind hole later constitutes a first tapering portion 114 of the through hole 108.

Still referring to FIG. 1, the process of forming the through hole 108 is continued, after carrying out the first laser drilling from the first main surface 104 with one laser shot 115 as described above, by carrying out a second laser drilling from the second main surface 106 with one further laser shot 117, i.e., by altogether two laser shots 115, 117. Thereby, the illustrated through hole 108 is formed with a first tapering portion 114 extending from the first main surface 104 and resulting from the first laser shot 115, and with a second tapering portion 116 extending from the second main surface 106 and resulting from the second laser shot 117. The second laser shot 117 is carried out after the first laser shot 115 and from the back side, i.e., extending the previously formed blind hole into the through hole 108 extending through the entire thickness of the electrically insulating layer structure 102. After the first laser shot 115 and before the second laser shot 117, the structure shown in FIG. 1 may be flipped or turned around by 180° so that the laser source (not shown) may remain stationary.

According to FIG. 1, the through hole 108 is formed by irradiating one and thereafter the other of the exposed main surfaces 104, 106 of the electrically insulating layer structure 102, being not covered by an electrically conductive layer structure, with a respective laser shot 115, 117. More specifically, forming the through hole 108 comprises irradiating the first main surface 104, being not covered by an electrically conductive layer structure with first laser shot 115 and subsequently irradiating the second main surface 106, being not covered by an electrically conductive layer structure, with second laser shot 117. Thus, forming the through hole 108 comprises directly irradiating each of the exposed main surfaces 104, 106 of the electrically insulating layer structure 102 with a respective one of the laser shot 115, 117. The laser shots 115, 117 may provide the electrically insulating layer structure 102 with a uniform laser energy.

In one embodiment, the obtained through hole 108 with a substantial X-shape as shown in FIG. 1 may be made subject to a subsequent procedure of filling the through hole 108 with electrically conductive material such as copper. The shape of the through hole 108 may also be denoted as the shape of a vertical bow tie. The through hole filling procedures illustrated and described below referring to FIG. 2 and FIG. 3 can start on the basis of through hole 108 with substantial X-shape as shown in FIG. 1. Alternatively, and referring to FIG. 5, it is also possible to carry out a further laser shot 119 before filling the through hole 108 with electrically conductive material, which results in a modified shape of through hole 108.

Again, referring to FIG. 1, a narrowest diameter, C, of the through hole 108 may be in a range between approximately 55 μm and approximately 70 μm. The value of this parameter may be adjusted in particular by correspondingly adapting the laser processing described referring to FIG. 1 or FIG. 5. For instance, selection of the type of laser source, of the diameter of the respective laser beam, and/or of the temporal length of laser pulses used for laser shots 115, 117 and optionally 119 are parameters having an impact on the value of the narrowest diameter, C. Furthermore, a combination with other geometrical parameters may be highly advantageous, as will be described below.

A preferably thin core layer with thickness H, in form of purely dielectric electrically insulating layer structure 102, with laser through hole 108 has the shape of a (preferably small) tapering outside of the center to facilitate subsequent bridging, as shown in FIG. 3. Vertical thickness H (which may also be denoted as dielectric thickness) of the electrically insulating layer structure 102 may be not more than 110 μm (for instance may be in the range between 40 μm and 60 μm), so that the electrically insulating layer structure 102 is embodied as a thin core layer. Forming a copper filled laser via in such a thin core layer is usually highly critical. With the concept of forming through hole 108 in a purely dielectric layer structure 102 and in particular in combination with the described set of parameters, it is however possible to obtain a high via reliability also with such a thin core layer.

As can be taken from a detail 131 and a detail 133 in FIG. 1, a roughness Rz of sidewalls 112 in the first tapering portion 114 is smaller than a roughness Rz of sidewalls 112 in the second tapering portion 116. This corresponds to a vertical extension d1 of the first tapering portion 114 being larger than a vertical extension d2 of the second tapering portion 116, i.e., d1>d2. For instance, d1 may be at least 60% of H, whereas d2 may be not more than 40% of H, and d1+d2=H. Descriptively speaking, the smaller surface area of the sidewalls 112 in the second tapering portion 116 providing a small adhesion surface area with regard to subsequently applied metallic material may be compensated by the locally increased roughness Rz in the second tapering portion 116, as compared to the smaller roughness Rz in the first tapering portion 114 providing a larger adhesion surface area with regard to the subsequently applied metallic material. Thus, sidewalls 112 may be formed with different values of the roughness Rz on the upper/lower side of the, or in other words above and below a narrowest portion of through hole 108. Preferably, the higher roughness is on the smaller side to the tapering in order to balance the adhesion of the copper on the side-walls 112 of later formed seed layer 144 and/or plating layer 153. The longer sidewall 112 may have a smoother surface, whereas the shorter sidewall 112 may have a rougher surface. In particular and as described below in further detail, the roughness Rz of sidewalls 112 in the first tapering portion 114 and in the first tapering portion 114 may be different for ensuring a homogeneous adhesion of a later formed electrically conductive filling medium 151 on the sidewalls 112.

As yet another one of the advantageous set of parameters, a lateral offset J (which may also be denoted as via offset between front and bottom side between a center of the first tapering portion 114 and a center of the second tapering portion 116, as shown in FIG. 1) is not more than 3 μm. More specifically, the lateral offset J may be defined as a horizontal distance between a vertical center axis 191 of the first tapering portion 114 and a vertical center axis 193 of the second tapering portion 116. Preferably, the value of the offset J is not more than 3 μm. Highly preferably, the value of the offset J is not more than 1 μm. This further reduces the risk of cracks and voids.

In order to obtain the layer structure shown in FIG. 2, the through hole 108 according to FIG. 1 is made subject to a first procedure of filling it with an electrically conductive filling medium 151 such as copper.

In order to accomplish this, it is preferable to firstly carry out an electroless deposition procedure to thereby form a thin seed layer 144 of copper directly covering the sidewalls 112 of the electrically insulating layer structure 102 delimiting the through hole 108. This can be seen in a detail 121 in FIG. 4. A thickness, m, of the seed layer 144 may be for instance 0.5 μm. However, it is also possible that the seed layer 144 has a thickness above 1 μm and/or that several cumulative seed layers are provided. For example, a thickness of a seed layer 144 or a cumulative thickness of a plurality of seed layers 144 may be in a range between 0.5

μm and 5 μm. When multiple seed layers 144 are provided, they may comprise an organic (for instance polymer layer, a palladium layer, and/or a copper layer.

Figure 4:
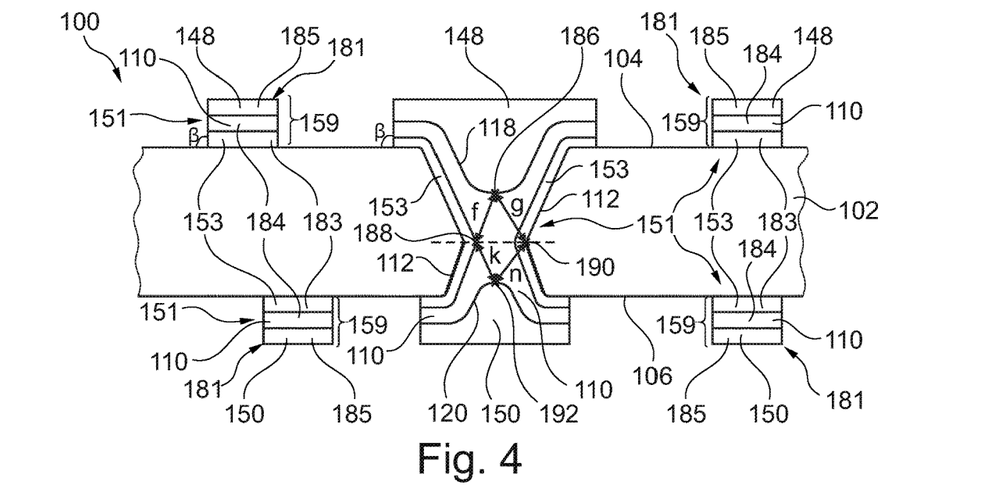
FIG. 4 illustrates a cross-sectional view of a component carrier with metal filled through hole and horizontal tracks according to an exemplary embodiment of the invention.

Moreover, and as shown as well in detail 121, the method may optionally further comprise forming a bonding layer 155 having a substantially homogeneous thickness h, between the sidewalls 112 and the below described plating layer 153 (or the optional seed layer 144). The optional bonding layer 155 may be provided with more or less similar or homogeneous thickness, h, on the core layer-type electrically insulating layer structure 102 and on the sidewalls 112 of the opening or through hole 108 at least on one side.

Subsequently, further electrically conductive material (such as copper) may be deposited in form of plating layer 153 on the seed layer 144 and/or on the bonding layer 155 by a plating procedure, in particular by galvanically plating. Alternatively, it is also possible to omit seed layer 144 and/or bonding layer 155 and apply the material of plating layer 153 directly on the dielectric surface of the sidewalls 112 of electrically insulating layer structure 102. Thus, the sidewalls 112 as well as the main surfaces 104, 106 may be covered by a thicker plating layer 153 of the electrically conductive filling medium 151 such as copper. For instance, the plating layer 153 may have a substantially constant thickness, b, of for instance 10 μm.

As can be taken from a detail 171 and a detail 173 in FIG. 2, the roughness Rz of sidewalls 112 in the first tapering portion 114 is smaller than in the second tapering portion 116. As a result, and as described above, a homogeneously high adhesion of the plating layer 153 to the sidewalls 112 over the entire extension of through hole 108 can be ensured.

Thus, the manufacturing procedure is continued by forming part of electrically conductive filling medium 151 by forming plating layer 153, having a substantially homogeneous thickness b, as an integral structure covering the sidewalls 112 of the through hole 108 and covering the main surfaces 104, 106. As can be taken from detail 121, formation of the plating layer 153 is carried out after formation of seed layer 144 and/or after formation of bonding layer 155. The integral electrically conductive structure or plating layer 153 covers sidewalls 112 of the through hole 108 and the main surfaces 104, 106 of the electrically insulating layer structure 102. However, no metal foil is arranged between the integral electrically conductive structure 153 and the main surfaces 104, 106, so that no disturbing overhang is created. As shown in FIG. 2, the integral electrically conductive structure 153 continuously lines the sidewalls 112 and the main surfaces 104, 106 including angled transitions 139 between the sidewalls 112 and the main surfaces 104, 106. The integral electrically conductive structure or plating layer 153 can be arranged directly on the seed layer 144, directly on the bonding layer 155, or directly on the dielectric sidewalls 112 and the dielectric main surfaces 104, 106.

Hence, FIG. 2 shows formation of plating layer 153 as a metal layer with more or less uniform thickness b on the purely dielectric core layer (in form of electrically insulating layer structure 102) and on the sidewalls 112 of the opening at least on one side. It is also possible to create the first metal layer on one side of the electrically insulating layer structure 102 by PVD techniques like sputtering and on the other side with electroless deposition.

Referring to FIG. 3, a further plating procedure may be carried out following the one described referring to FIG. 2 so as to form an electrically conductive bridge structure 110 with a substantially horizontal portion connecting opposing sidewalls 112 of the through hole 108. The bridge structure 110 also comprises slanted legs covering the plating layer 153. As shown, the electrically conductive bridge structure 110, which also forms part of the electrically conductive filling medium 151, is formed to be delimited by an upper first demarcation surface 118 oriented upwardly and by a lower second demarcation surface 120 orientated downwardly. Forming the electrically conductive bridge structure 110 may be carried out by galvanic plating, preferably following the optional formation of the seed layer 144, the optional formation of the bonding layer 155, and the formation of the plating layer 153. Thus, the bridge structure 110 forms a substantially horizontal bridge between opposing sidewalls 112 of the electrically insulating layer structure 102 delimiting the through hole 108 and comprises slanted legs on the plating layer 153.

In the region of the narrowest portion of the through hole 108, the substantially horizontal bridge structure 110 is formed connecting the opposing sidewalls 112. A concave upper limiting surface corresponds to the first demarcation surface 118, whereas a lower concave limiting surface of the bridge structure 110 corresponds to the second demarcation surface 120.

Still referring to FIG. 3, a first electrically conductive bulk structure 148 filling a major part above the first demarcation surface 118 and a second electrically conductive bulk structure 150 filling a major part below the second demarcation surface 120 are formed. This can be done by carrying out a further galvanic plating following the previous plating procedure of forming the bridge structure 110.

Thus, the component carrier 100 according to FIG. 3 can be obtained by carrying out further plating. Thereby, the bulk structures 148, 150, which may for instance consist of copper, can be obtained. In the illustrated embodiment, a small dip 125, 127, respectively, remains at an upper side or a lower side of the shown component carrier 100. In other embodiments, the bulk structures 148, 150 fill the remaining recesses above the first demarcation surface 118 and below the second demarcation surface 120 almost completely. It should be said that it is well-known by a skilled person that the demarcation surfaces 118, 120 are clearly visible when imaging a cross-section of the component carrier 100.

In the shown embodiment, the illustrated component carrier 100 can be a laminate-type plate-shaped component carrier 100 such as a printed circuit board (PCB). The component carrier 100 may comprise a layer stack composed of the central electrically insulating layer structure 102 being covered on each of its opposing main surfaces 104, 106 by the plated electrically conductive filling medium 151. Preferably, the electrically insulating layer structure 102 is made of a fully cured material such as FR4. The electrically conductive filling medium 151 may be plated copper.

The through hole 108 extending through the electrically insulating layer structure 102 between the first main surface 104 and the second main surface 106 is filled in a central portion thereof with electrically conductive filling medium 151 such as copper. This electrically conductive filling medium comprises the electrically conductive bridge structure 110 connecting opposing sidewalls 112 of the electrically insulating layer structure 102 delimiting the through hole 108. In the configuration of FIG. 3, the horizontal section of the bridge structure 110 is located around a narrowest portion of the substantially X-shaped through hole 108. Apart from its substantially horizontal section, the bridge structure 110 also covers the sidewalls 112 and therefore has a substantial H-shape. The electrically conductive bridge structure 110 is arranged on the plating layer 153 and connects opposing sidewalls 112 of the electrically insulating layer structure 102 delimiting the through hole 108.

As mentioned above, as another advantageous design parameter, narrowest horizontal diameter C (which may also be denoted as via middle diameter of the through hole 108) may be in a range between 55 µm and 70 µm.

As yet another one of the advantageous set of parameters, a minimum vertical thickness B (which may also be denoted as total bridging copper thickness of the bridge structure 110) is at least 20 µm. It has turned out that a sufficiently thick bridge structures 110 has a very positive impact on via reliability.

Hence, FIG. 3 illustrates plating of further layers (for instance next layer for bridging, afterwards filling the hole) to thereby complete formation of the electrically conductive filling medium 151.

As shown in FIG. 3 and as a consequence of the described manufacturing process, the integral electrically conductive structure or plating layer 153 connects the sidewalls 112 with the main surfaces 104, 106 without any overhang (compare reference numeral 209 in the conventional structures illustrated in FIG. 6 and FIG. 7). Furthermore, as shown in FIG. 3 as well, the integral electrically conductive structure or plating layer 153 substantially (with the only exception of the optional seed layer 144 and/or the optional bonding layer 155) consists of plated metal and is in particular free of laminated copper foils.

FIG. 4 illustrates a cross-sectional view of a component carrier 100 with vertical through hole 108 and horizontally extending electrically conductive tracks 181 according to an exemplary embodiment of the invention.

During and/or after formation of the electrically conductive filling medium 151, the plating layer 153, the bridge structure 110 and the bulk structures 148, 150 may be patterned on one or both of the main surfaces 104, 106 so as to form one or several layer stacks 159 on one or both of the first main surface 104 and the second main surface 106. By taking this measure, it is possible to form one or more electrically conductive tracks 181 in form of the stacks 159 of multiple plated structures 183 to 185 on the electrically insulating layer structure 102 simultaneously, i.e., in common deposition procedures, with the formation of the electrically conductive filling medium 151 in the through hole 108. This is a very efficient approach of filling laser through holes 108 and forming electrically conductive tracks 181 of component carrier 100. In order to form the stacks 159, the method comprises forming various resist structures before and/or between forming different constituents of the electrically conductive filling medium 151.

According to FIG. 4, the electrically conductive filling medium fills the through hole 108 and comprises a first number of multiple stacked structures 153, 110, 148, 150. Thus, the first number is four in this embodiment. Moreover, electrically conductive tracks 181 partially cover each of the main surfaces 104, 106 of the electrically insulating layer structure 102. The tracks 181 on the first main surface 104 comprise a second number of multiple stacked structures 153, 110, 148, so that the second number of the tracks 181 on the first main surface 104 is three in this embodiment. Correspondingly, the tracks 181 on the second main surface 106 comprise a second number of multiple stacked structures 153, 110, 150, so that the second number of the tracks 181 on the second main surface 104 is three in this embodiment. Thus, the first number is by one larger than each of the second numbers.

In another embodiment, the first number and the second number may be the same (in particular both three).

Hence, depending on details of the described structuring method, resist may be applied between the individual manufacturing processes. For instance, in terms of semi-additive processing (SAP), resist may be applied after forming bonding layer 155 or after forming plating layer 153 depending on the material of bonding layer. In a full additive processing approach, such a resist may be applied after forming bonding layer 155 to create electrically conductive paths at the time of filling the through holes 108. Thus, the copper structure (in particular in terms of the number of layers and/or height of the first metal layer) of the tracks 181 may be similar to those on the sidewalls 112 of the laser through hole 108, as shown in FIG. 4.

Still referring to FIG. 4, a distance, f, between a point 188 on the sidewall 112 at which a width of the through hole 108 is minimum, and a lowermost point 186 of the first demarcation surface 118 is at least 20 µm. If this highly advantageous design rule is respected according to a preferred embodiment of the invention, a void-free and crack-free copper filled laser via can be obtained. Correspondingly, a distance, g, between another point 190 (opposing point 188) on the sidewall 112 at which the width of the through hole 108 is minimum, and the lowermost point 186 of the first demarcation surface 118 is at least 20 µm. It is also advantageous if a distance, k, between the point 188 and an uppermost point 192 of the second demarcation surface 120 is at least 20 µm. Correspondingly, a distance, n, between the point 190 and the uppermost point 192 of the second demarcation surface 120 may be at least 20 µm. These design rules also contribute to a high reliability of component carrier 100.

In a conventional approach, copper layers of the core have to be etched after plating the holes in order to create the structure which causes a lot of copper waste. In contrast to this, exemplary embodiments of the invention (such as the one shown in FIG. 4) reduce the ecological foot print of a PCB perceptible.

Still referring to FIG. 4, at least part of the stacks 159 as well as portions of the electrically conductive filling medium 151 filling the through hole 108 and extending beyond the main surfaces 104, 106 may be formed by semi-additive processing. The laterally delimited layer stacks 159 and upwardly and downwardly protruding portions of the electrically conductive filling medium 151 (composed of the plating layer 153, the bridge structure 110 and a respective one of the bulk structures 148, 150) have sidewalls having an angle, β, with a respective one of the first main surface 104 or the second main surface 106 very close to 90°. For instance, the angle β may be in a range between 85° and 95°, and preferably in a range between 89° and 91°.

Figure 5:
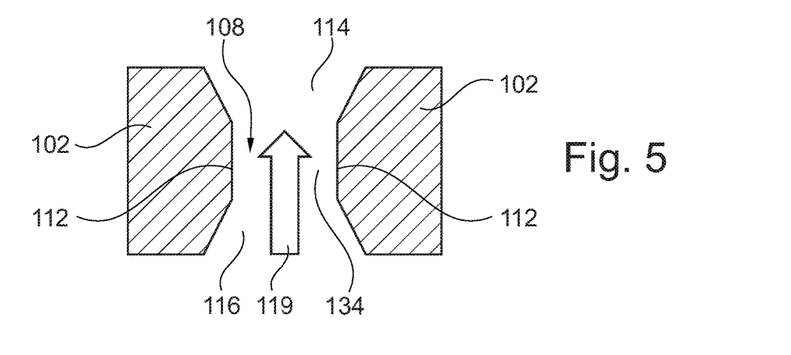
FIG. 5 illustrates a cross-sectional view of a pre-form of a component carrier with a through hole having two tapering sections and a straight section in between according to another exemplary embodiment of the invention.

FIG. 5 illustrates a cross-sectional view of a pre-form of a component carrier 100 with a through hole 108 according to still another exemplary embodiment of the invention.

Referring to the embodiment of FIG. 5, forming the through hole 108 comprises carrying out, in addition to the first laser drilling from the first main surface 104 with one laser shot 115 and in addition to the second laser drilling from the second main surface 106 with the second laser shot 117, a third laser drilling by a third laser shot 119 from the backside as well. FIG. 5 hence shows how a third laser shot 119 is carried out from the back side or from the second main surface 106 of the electrically insulating layer structure 102 following the procedure described referring to FIG. 1. By taking this measure, the shape of the through hole 108 can be further manipulated so that the narrowest portion of the through hole 108 is spatially widened and a for instance substantially circular cylindrical central connection portion 134 is formed between the tapering portions 114, 116. According to FIG. 5, two opposing exterior portions of the through hole 108 are tapering, whereas a central portion of the through hole 108 is substantially cylindrical. In the configuration of FIG. 5, the central connection portion 134 connects the first tapering portion 114 with the second tapering portion 116.

The horizontal section of the bridge structure 110 may be located in the central connection portion 134 according to FIG. 5. Some or all of the design rules concerning the various dimensions explained above may also be fulfilled in the embodiment according to FIG. 5, but will not be explained again for the sake of conciseness.

It should be noted that the term "comprising" does not exclude other elements or steps and the "a" or "an" does not exclude a plurality. Also, elements described in association with different embodiments may be combined.

Implementation of the invention is not limited to the preferred embodiments shown in the figures and described above. Instead, a multiplicity of variants is possible which use the solutions shown and the principle according to the invention even in the case of fundamentally different embodiments.

The invention claimed is:

1. A method of manufacturing a component carrier, comprising:
   forming a through hole between a first main surface and a second main surface of an electrically insulating layer structure by removing material from at least one of the main surfaces of the electrically insulating layer structure by irradiating at least one of the main surfaces of the electrically insulating layer structure with at least one laser shot;
   wherein the at least one main surface from which material is removed is not covered by an electrically conductive layer structure at least in a surface region in which the through hole is to be formed;
   wherein the through hole has a first tapering portion extending from the first main surface and a second tapering portion extending from the second main surface;
   the through hole including at least one of the following features;
   a roughness Rz of at least part of the sidewalls in the first tapering portion is different from a roughness Rz of at least part of the sidewalls in the second tapering portion;
   a roughness Rz of at least part of the sidewalls in the first tapering portion is smaller than a roughness Rz of at least part of the sidewalls in the second tapering portion;
   a vertical extension of the first tapering portion is larger than a vertical extension of the second tapering portion;
   subsequently, at least partially filling the through hole; and
   at least partially covering the main surfaces of the electrically insulating layer structure by an electrically conductive filling medium.

2. The method according to claim 1, comprising at least one of the following features:
   wherein forming the through hole comprises irradiating the first main surface with a first laser shot and subsequently irradiating the second main surface with only one second laser shot, wherein both the first main surface and the second main surface are uncovered by an electrically conductive layer structure;
   wherein forming the through hole comprises irradiating the first main surface with a first laser shot and irradiating the second main surface with two second laser shots, wherein both the first main surface and the second main surface are uncovered by an electrically conductive layer structure;
   wherein forming the through hole comprises irradiating the electrically insulating layer structure only from the first main surface with the first main surface uncovered by an electrically conductive layer structure;
   wherein the at least one main surface to be irradiated is not covered at all by an electrically conductive layer structure during the irradiating;
   wherein the at least one main surface to be irradiated is, during the irradiating, is covered only partially by an electrically conductive layer structure in a surface region of the at least one main surface which surface region is not to be irradiated by the at least one laser shot;
   wherein the method comprises, before the irradiating, forming an electrically conductive layer structure on the at least one main surface to be irradiated, and subsequently and still before the irradiating, removing part of the electrically conductive layer structure at least in a surface portion of the at least one main surface which is to be irradiated by the at least one laser shot;
   wherein forming the through hole comprises directly irradiating at least one of the exposed main surfaces of the electrically insulating layer structure with the at least one laser shot;
   wherein forming the through hole by laser shots irradiated onto the electrically insulating layer structure from both opposing main surfaces, is carried out with a uniform laser energy;
   wherein the method comprises forming at least one electrically conductive track comprising a stack of multiple plated structures on the electrically insulating layer structure at least partially simultaneously with the formation of the electrically conductive filling medium and/or by semi-additive processing.

3. The method according to claim 1, further comprising:
   forming at least part of the electrically conductive filling medium by forming a plating layer having an annular shape and/or a substantially homogeneous thickness as an integral structure covering at least part of sidewalls delimiting the through hole and at least partially covering the main surfaces, following formation of a seed layer.

4. The method according to claim 3, comprising at least one of the following features:
   forming by plating, part of the electrically conductive filling medium as an electrically conductive bridge structure on the plating layer and connecting opposing sidewalls of the electrically insulating layer structure delimiting the through hole,
   wherein forming part of the electrically conductive filling medium includes forming a first electrically conductive bulk structure filling at least part of a volume between a first demarcation surface and the first main surface, delimiting the bridge structure upwardly, and/or by forming a second electrically conductive bulk structure filling at least part of a volume between a second demarcation surface and the second main surface, delimiting the bridge structure downwardly, wherein the method comprises forming at least one of the group consisting of the first electrically conductive bulk structure and the second electrically conductive bulk structure by at least one further plating procedure;
forming a bonding layer having a substantially homogeneous thickness between at least part of the sidewalls and at least part of the main surfaces, on the one hand, and the plating layer on the other hand.

5. A method of manufacturing a component carrier, comprising:
providing an electrically insulating layer structure with a thickness of less than 110 μm and having a first main surface and a second main surface;
forming a through hole extending through the electrically insulating layer structure between the first main surface and the second main surface, wherein the through hole is formed with:
a first partial hole extending from the first main surface into the electrically insulating layer structure, the first partial hole defined by a first tapering portion extending from the first main surface;
a second partial hole extending from the second main surface into the electrically insulating layer structure; the second partial hole defined by a second tapering portion extending from the second main surface; and
a lateral offset between a center axis of the first partial hole and a center axis of the second partial hole being less than 3 μm;
the through hole including at least one of the following features:
a roughness Rz of at least part of the sidewalls in the first tapering portion is different from a roughness Rz of at least part of the sidewalls in the second tapering portion;
a roughness Rz of at least part of the sidewalls in the first tapering portion is smaller than a roughness Rz of at least part of the sidewalls in the second tapering portion;
a vertical extension of the first tapering portion is larger than a vertical extension of the second tapering portion;
optionally, at least partially filling the through hole, and/or at least partially covering the main surfaces of the electrically insulating layer structure by an electrically conductive filling medium.

6. A method of manufacturing a component carrier, comprising:
providing an electrically insulating layer structure having a first main surface and a second main surface;
forming a through hole extending through the electrically insulating layer structure between the first main surface and the second main surface;
wherein the through hole has a first tapering portion extending from the first main surface and a second tapering portion extending from the second main surface;
the through hole concluding at least one of the following features;
a roughness Rz of at least part of the sidewalls in the first tapering portion is different from a roughness Rz of at least part of the sidewalls in the second tapering portion;
a roughness Rz of at least part of the sidewalls in the first tapering portion is smaller than a roughness Rz of at least part of the sidewalls in the second tapering portion;
a vertical extension of the first tapering portion is larger than a vertical extension of the second tapering portion;
at least partially filling the through hole by an electrically conductive filling medium comprising a first number of multiple stacked structures; and
forming at least one electrically conductive track partially covering at least one of the main surfaces of the electrically insulating layer structure and comprising a second number of multiple stacked structures;
wherein a difference between the first number and the second number is zero or one.

7. A component carrier, comprising:
an electrically insulating layer structure having a first main surface and a second main surface;
a through hole extending through the electrically insulating layer structure between the first main surface and the second main surface;
wherein the through hole has a first tapering portion extending from the first main surface and a second tapering portion extending from the second main surface;
an integral electrically conductive structure covering sidewalls of the through hole, extending up to one or both of the main surfaces and covering at least part of the main surfaces of the electrically insulating layer structure;
the component carrier further comprising at least one of the following features;
a roughness Rz of at least part of the sidewalls in the first tapering portion is different from a roughness Rz of at least part of the sidewalls in the second tapering portion;
a roughness Rz of at least part of the sidewalls in the first tapering portion is smaller than a roughness Rz of at least part of the sidewalls in the second tapering portion;
a vertical extension of the first tapering portion is larger than a vertical extension of the second tapering portion.

8. The component carrier according to claim 7,
wherein the integral electrically conductive structure is a plating layer having an annular shape and/or having a substantially homogeneous thickness covering at least part of sidewalls of the through hole and at least partially covering the main surfaces being arranged on a seed layer comprising an electrically conductive bridge structure being substantially H-shaped, on the plating layer and connecting opposing sidewalls of the electrically insulating layer structure delimiting the through hole, wherein a minimum vertical thickness of the bridge structure is at least 20 μm and/or the component carrier comprises a first electrically conductive bulk structure filling at least a portion between a first demarcation surface and the first main surface, delimiting the bridge structure upwardly, and/or comprising a second electrically conductive bulk structure filling at least a portion between a second demarcation surface and the second main surface, delimiting the bridge structure downwardly.

9. The component carrier according to claim 8, comprising at least one of the following features:
wherein at least one of the first electrically conductive bulk structure and the second electrically conductive bulk structure is configured as at least one further plating structure;
wherein the plating layer, the bridge structure and the at least one bulk structure are patterned on at least one of the first main surface and the second main surface so as to form at least one laterally delimited further layer stack, wherein the at least one laterally delimited further layer stack and/or a portion of the plating layer, the bridge structure and the at least one bulk structure extending vertically beyond the through hole have sidewalls having an angle with a respective one of the first main surface or the second main surface in a range between 85° and 95°.

10. The component carrier according to claim 7, comprising at least one of the following features:
    wherein no metal foil is arranged between the integral electrically conductive structure and the main surfaces;
    wherein the integral electrically conductive structure continuously lines the sidewalls and the main surfaces including an angled transition between the sidewalls and the main surfaces;
    at least one bonding layer having a substantially homogeneous thickness between at least part of the sidewalls and at least part of the main surfaces, on the one hand, and the integral electrically conductive structure on the other hand.

11. The component carrier according to claim 7, comprising at least one of the following features:
    wherein a thickness of the electrically insulating layer structure is not more than 110 µm;
    wherein the electrically insulating layer structure is a core layer consisting of dielectric material;
    wherein at least a part of the through hole is substantially X-shaped;
    wherein at least a part of the through hole has a central substantially cylindrical section between two opposing tapering sections.

12. The component carrier according to claim 7, wherein the through hole has a continuously tapering shape or has a substantially straight shape.

13. The component carrier according to claim 7, wherein the integral electrically conductive structure connects the sidewalls with the main surfaces without overhang.

14. The component carrier according to claim 7, wherein the integral electrically conductive structure substantially consists of plated metal and is free of laminated metal foils.

15. The component carrier according to claim 7, wherein the integral electrically conductive structure extends up to and continuously along one or both of the main surfaces.

16. The component carrier according to claim 7, comprising at least one of the following features:
    at least one component being surface mounted on and/or embedded in the component carrier, wherein the at least one component is selected from a group consisting of an electronic component, an electrically non-conductive and/or electrically conductive inlay, a heat transfer unit, a light guiding element, an energy harvesting unit, an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, an actuator, a microelectromechanical system, a microprocessor, a capacitor, a resistor, an inductance, an accumulator, a switch, a camera, an antenna, a magnetic element, a further component carrier, and a logic chip;
    wherein at least one of the integral electrically conductive structure, the bridge structure, and the at least one bulk structure includes at least one of the group consisting of copper, aluminum, nickel, silver, gold, palladium, and tungsten, any of the mentioned materials being optionally coated with a supra-conductive material such as graphene;
    wherein the electrically insulating layer structure includes at least one of the group consisting of resin, reinforced or non-reinforced resin, epoxy resin or Bismaleimide-Triazine resin, FR-4, FR-5, cyanate ester, polyphenylene derivate, glass, prepreg material, polyimide, polyamide, liquid crystal polymer, epoxy-based build-up material, polytetrafluoroethylene, a ceramic, and a metal oxide;
    wherein the component carrier is shaped as a plate;
    wherein the component carrier is configured as one of the group consisting of a printed circuit board, and a substrate;
    wherein the component carrier is configured as a laminate-type component carrier.

17. A component carrier, comprising:
    an electrically insulating layer structure with a thickness of less than 110 µm and having a first main surface and a second main surface;
    a through hole extending through the electrically insulating layer structure between the first main surface and the second main surface, wherein the through hole has:
    a first partial hole extending from the first main surface into the electrically insulating layer structure, the first partial hole defined by a first tapering portion extending from the first main surface; and
    a second partial hole extending from the second main surface into the electrically insulating layer structure, the second partial hole defined by a second tapering portion extending from the second main surface;
    wherein a lateral offset between a center axis of the first partial hole and a center axis of the second partial hole is less than 3 µm,
    the component carrier further comprising at least one of the following features;
    a roughness Rz of at east art of the sidewall is in the first tapering portion is different from a roughness Rz of at least part of the sidewalls in the second tapering portion;
    a roughness Rz of at least part of the sidewalls in the first tapering portion is smaller than a roughness Rz of at least part of the sidewall in the second tapering portion;
    a vertical extension of the first tapering portion is larger than a vertical extension of the second tapering portion.

18. A component carrier, comprising:
    an electrically insulating layer structure having a first main surface and a second main surface;
    a through hole extending through the electrically insulating layer structure between the first main surface and the second main surface;
    wherein the through hole has a first tapering portion extending from the first main surface and a second tapering portion extending from the second main surface;
    the through hole including at least one of the following features;
    a roughness Rz of at least part of the sidewalls in the first tapering portion is different from a roughness Rz of at least part of the sidewalls in the second tapering portion;
    a roughness Rz of at least part of the sidewalls in the first tapering portion is smaller than a roughness Rz of at least part of the sidewalls in the second tapering portion;

a vertical extension of the first tapering portion is larger than a vertical extension of the second tapering portion;
an electrically conductive filing medium at least partially filling the through hole and comprising a first number of multiple stacked structures;
at least one electrically conductive track partially covering at least one of the main surfaces of the electrically insulating layer structure and comprising a second number of multiple stacked structures;
wherein a difference between the first number and the second number is zero or one.

* * * * *